US012787787B2

(12) United States Patent
Sun et al.

(10) Patent No.: US 12,787,787 B2
(45) Date of Patent: Nov. 3, 2026

(54) SEMICONDUCTOR DEVICES WITH IN-PACKAGE PGS FOR COUPLING NOISE SUPPRESSION

(71) Applicant: MEDIATEK INC., Hsin-Chu (TW)

(72) Inventors: Ruey-Bo Sun, Hsinchu City (TW); Sheng-Mou Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 775 days.

(21) Appl. No.: 17/848,417

(22) Filed: Jun. 24, 2022

(65) Prior Publication Data

US 2023/0014046 A1 Jan. 19, 2023

Related U.S. Application Data

(60) Provisional application No. 63/221,047, filed on Jul. 13, 2021.

(51) Int. Cl.
*H10W 42/20* (2026.01)

(52) U.S. Cl.
CPC .................................. *H10W 42/20* (2026.01)

(58) Field of Classification Search
CPC ............................ H01L 23/645; H05K 1/0224
See application file for complete search history.

(56) References Cited

U.S. PATENT DOCUMENTS 8,575,730 B2 * 11/2013 Nakashiba ........... H05K 1/0224 257/422
9,607,950 B2 * 3/2017 Lee ........................ H10B 61/22
10,068,856 B2 * 9/2018 Kao ...................... H10W 42/00
10,192,833 B2 * 1/2019 Kuo ...................... H10W 42/20
11,728,292 B2 * 8/2023 Lin ....................... H10W 42/20 257/774
2003/0017646 A1 * 1/2003 Sridharan ........... H10W 20/497 361/780
2008/0129394 A1 * 6/2008 Kissing ................ H05K 1/0224 361/767
2008/0211067 A1 * 9/2008 Nakashiba ........... H05K 1/0224 257/659
2009/0085133 A1 * 4/2009 Doan ............... G06K 19/07749 438/59
2009/0090995 A1 * 4/2009 Yang ...................... H10D 84/00 257/E29.166
2009/0308653 A1 * 12/2009 Wu ........................ H01Q 1/526 361/818
2010/0109133 A1 * 5/2010 Ito ......................... H10W 90/00 257/E23.114

(Continued)

FOREIGN PATENT DOCUMENTS

CN 107611116 A 1/2018
CN 110610924 A 12/2019

(Continued)

*Primary Examiner* — Dale E Page
*Assistant Examiner* — Rohit Parthasarathy
(74) *Attorney, Agent, or Firm* — Winston Hsu

(57) ABSTRACT

According to an embodiment of the invention, a semiconductor device comprises a substrate, a semiconductor die and a first shielding structure. The semiconductor die is disposed on the substrate and comprises an electronic device. The first shielding structure is formed outside of the semiconductor die and disposed under the electronic device.

17 Claims, 4 Drawing Sheets

(56) References Cited

U.S. PATENT DOCUMENTS

| | | | | |
|---|---|---|---|---|
| 2011/0235302 | A1 * | 9/2011 | Hijioka | H10W 20/423 361/811 |
| 2013/0147023 | A1 * | 6/2013 | Lin | H10W 20/423 257/659 |
| 2014/0284763 | A1 * | 9/2014 | Yeh | H10D 1/20 438/381 |
| 2015/0221598 | A1 * | 8/2015 | Lee | H10B 61/22 257/295 |
| 2016/0071805 | A1 * | 3/2016 | Kuo | H10W 42/20 257/659 |
| 2017/0033059 | A1 | 2/2017 | Song | |
| 2018/0019210 | A1 * | 1/2018 | Kao | H10W 42/00 |
| 2018/0151290 | A1 * | 5/2018 | Yen | H01F 41/041 |
| 2023/0253390 | A1 * | 8/2023 | Sun | H10W 20/497 257/659 |
| 2024/0038690 | A1 * | 2/2024 | Li | H10D 1/20 |
| 2024/0355728 | A1 * | 10/2024 | Chang | H10W 20/427 |

FOREIGN PATENT DOCUMENTS

| | | | |
|---|---|---|---|
| TW | 200524127 | | 7/2005 |
| TW | 200636966 | | 10/2006 |
| TW | 200919637 | | 5/2009 |
| TW | 201133769 | A1 | 10/2011 |
| TW | 201933954 | A | 8/2019 |
| TW | 202105604 | A | 2/2021 |

* cited by examiner

SEMICONDUCTOR DEVICES WITH IN-PACKAGE PGS FOR COUPLING NOISE SUPPRESSION

CROSS REFERENCE TO RELATED APPLICATIONS

This application claims the benefit of U.S. Provisional Application No. 63/221,047, filed on Jul. 13, 2021. The content of the application is incorporated herein by reference.

BACKGROUND

On-chip inductor is a general element frequently used in semiconductor devices, but it is a very sensitive block which is easily interfered by coupling noises of other aggressors. The aggressors might be on-chip, package, or PCB circuits or layout routings. Some on-chip approaches have been proposed to address the problem of coupling noise. However, those approaches cannot reduce the coupling noise to the victim's on-chip inductor from some aggressors located in package.

Therefore, a new solution deploying to the semiconductor device structure being effective for the suppression of the coupling noise is highly required.

SUMMARY

It is an objective of the invention to provide a novel semiconductor device structure being effective for the suppression of the coupling noise.

According to an embodiment of the invention, a semiconductor device comprises a substrate, a semiconductor die and a first shielding structure. The semiconductor die is disposed on the substrate and comprises an electronic device. The first shielding structure is formed outside of the semiconductor die and disposed under the electronic device.

According to another embodiment of the invention, a semiconductor device comprises a substrate, a semiconductor die, a first shielding structure and a second shielding structure. The semiconductor die is disposed on the substrate and comprises an electronic device. The first shielding structure is formed outside of the semiconductor die and disposed under the electronic device. The second shielding structure is formed inside of the semiconductor die and disposed above the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
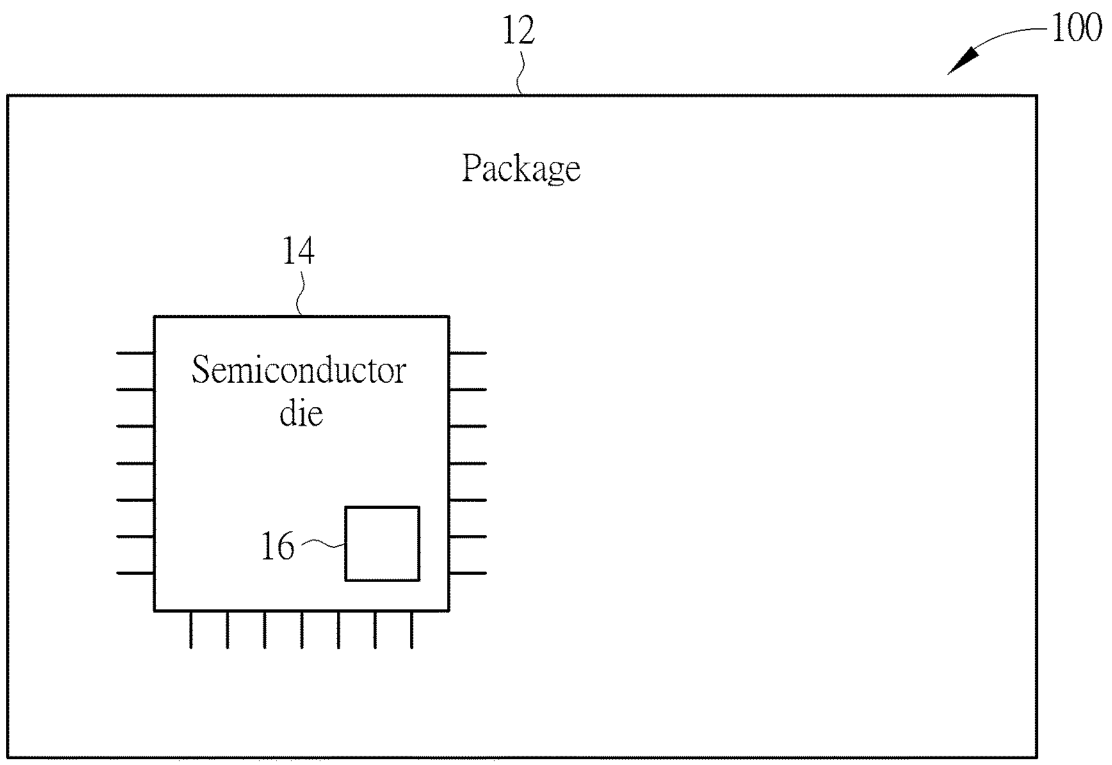
FIG. 1 illustrates an exemplary top view of a semiconductor device according to an embodiment of the invention.

FIG. 1 illustrates an exemplary top view of a semiconductor device according to an embodiment of the invention. The semiconductor device 100 comprises at least one in-package shielding structure (not shown in FIG. 1) to suppress coupling noise. In the top view of the semiconductor device 100, a semiconductor die 14 is disposed or mounted on the substrate of a package structure, such as the package 12 shown in FIG. 1, and the semiconductor die 14 may comprise an electronic device 16. With the in-package shielding structure, the unwanted coupling noise that may degrade the performance of the electronic device 16 is effectively suppressed.

It is to be noted FIG. 1 presents a simplified diagram of a semiconductor device in which only the components relevant to the invention are shown. As will be readily appreciated by a person of ordinary skill in the art, a semiconductor device may further comprise other components not shown in FIG. 1 and configured for implementing the corresponding functions thereof. Therefore, the components in a semiconductor device should not be limited to what is shown in FIG. 1.

Figure 2:
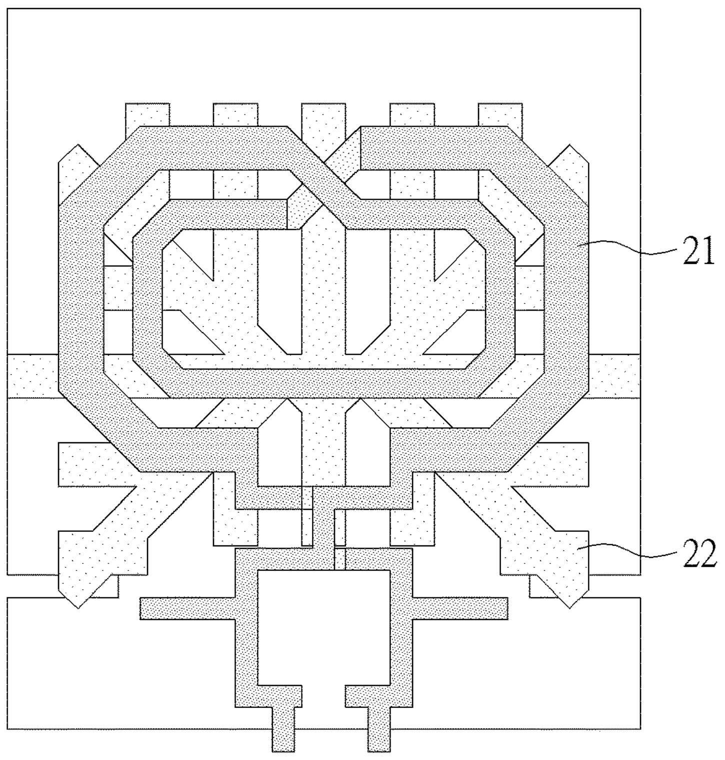
FIG. 2 is a drawing of partial enlargement of a top view of a semiconductor device with at least one in-package shielding structure according to an embodiment of the invention.

FIG. 2 is a drawing of partial enlargement of a top view of a semiconductor device with at least one in-package shielding structure according to an embodiment of the invention. FIG. 2 is also a perspective drawing showing the on-die layout which is view from the top of the semiconductor die comprised in the semiconductor device. According to an embodiment of the invention, the electronic device comprised in the semiconductor die may be an inductor or an inductive device. As shown in FIG. 2, a shielding structure 22 is beneath (or, under or directly below) an on-die inductor 21.

In an embodiment of the invention, the shielding structure 22 may be formed outside of the semiconductor die and disposed under or directly below the inductor 21. The shielding structure 22 may be comprised in the package substrate (not shown in FIG. 2) and a projection area of the inductor 21 on a predetermined plane and the shielding structure 22 (or, a projection area of the shielding structure 22 on the predetermined plane) may overlap, where the predetermined plane may be any layer of the semiconductor device or may be a top surface (or plane) or bottom surface (or plane) of the semiconductor device. In an embodiment of the invention, the shielding structure 22 may be formed in a layer under the top metal layer (or, may be named as the AP layer) of the semiconductor die.

In an embodiment of the invention, the shielding structure 22 may be a patterned ground shield (PGS) with a plurality of stripes and a plurality of slots between the strips. The shielding structure 22 may be formed of metal and may have a symmetric pattern. However, it is to be noted that having a symmetric pattern is not a limit of the invention.

Figure 3:
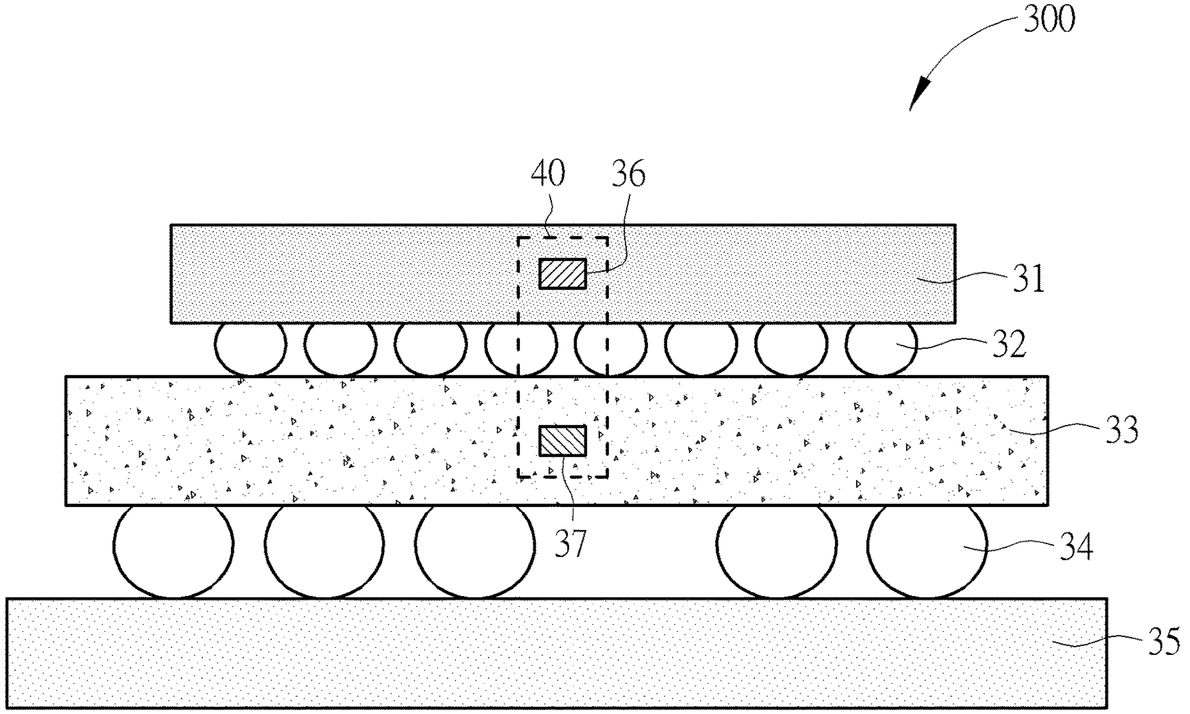
FIG. 3 shows an exemplary section view of a semiconductor device according to an embodiment of the invention.

FIG. 3 shows an exemplary section view of a semiconductor device having a flip chip package structure according to an embodiment of the invention. The semiconductor device 300 may comprise a silicon die (or, may be named as semiconductor die) 31 disposed on a package substrate 33. The silicon die 31 may be connected to one side of the package substrate 33 via one or more solder balls (bumps) 32. The package substrate 33 may be connected to the PCB 35 via one or more solder balls 34. In this embodiment, the silicon die 31 may comprise an electronic device 36 and the package substrate 33 may comprise a shielding structure 37 placed beneath (or, under or directly below) the electronic device 36 and is in a projection area of the electronic device 36 in a vertical direction (e.g. a direction from the top surface to the bottom of the semiconductor device 300 or a direction from the silicon die 31 to the PCB 35, and the projection area may be the area of a projection formed on the aforementioned predetermined plane).

It is to be noted that the flip chip package structure shown in FIG. 3 is merely one of a plurality of package structure to which the proposed semiconductor device structure can be applied, and thus the invention should not be limited thereto. In addition, FIG. 3 presents a simplified diagram of a semiconductor device in which only the components relevant to the invention are shown. As will be readily appreciated by a person of ordinary skill in the art, a semiconductor device and a semiconductor die may further comprise other components not shown in FIG. 3 and configured for implementing the corresponding functions thereof. Therefore, the components in a semiconductor device should not be limited to what is shown in FIG. 3.

Figure 4:
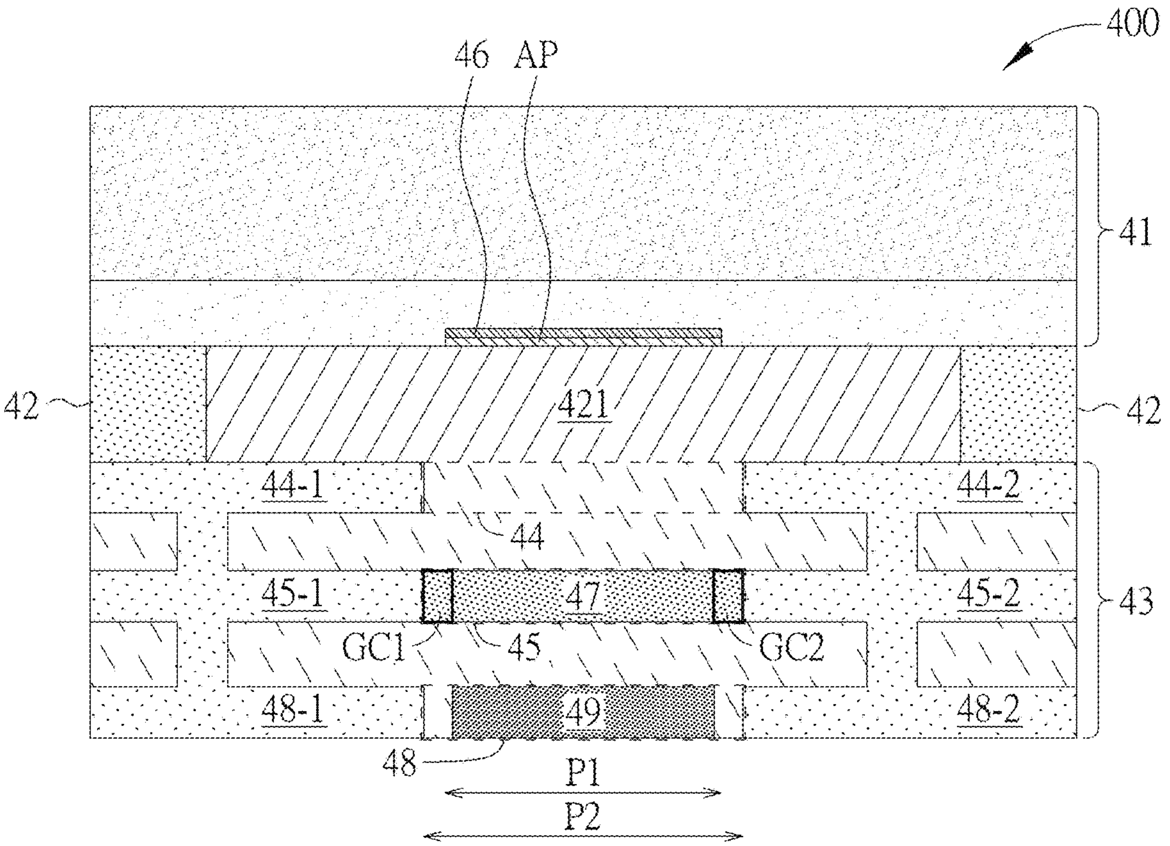
FIG. 4 is a drawing of partial enlargement of a section view of a semiconductor device according to an embodiment of the invention.

FIG. 4 is a drawing of partial enlargement of a section view of a semiconductor device according to an embodiment of the invention. In an embodiment of the invention, FIG. 4 shows the enlargement of the semiconductor segment 40 in FIG. 3.

The semiconductor device 400, which may be a possible implementation of the semiconductor segment 40 as shown in FIG. 3, may comprise a semiconductor die portion 41 and a package substrate portion 43. The semiconductor die portion 41 may comprise at least one silicon (Si) type substrate and an interconnection structure which contains a plurality of metal layers and dielectric layers. The semiconductor die portion 41 may be connected to package substrate portion 43 via solder balls (bumps) 42. An underfill encapsulant 421 may be comprised in the gap between the semiconductor die and package substrate around solder balls 42 to fill the gap.

The semiconductor die portion 41 may comprise an electronic device, such as the inductor 46, and the package substrate portion 43 may comprise a shielding structure 47 placed beneath (or, under or directly below) the inductor 46 and is in a projection area P1 of the inductor 46 in a vertical direction (e.g. a direction from the semiconductor die portion 41 to the package substrate portion 43), wherein the projection area P1 may be the area of a projection formed on the aforementioned predetermined plane. According to an embodiment of the invention, the shielding structure 47 may be located within a range where the electronic device or the inductor 46 is projected on the aforementioned predetermined plane in a vertical direction.

According to an embodiment of the invention, the package substrate may comprise a plurality of metal layers, such as the metal layers 44-1, 44-2, 45-1, 45-2, 48-1 and 48-2, where the metal layers 44-1 and 44-2 may be the same layer, the metal layers 45-1 and 45-2 may be the same layer and the metal layers 48-1 and 48-2 may be the same layer, and one or more dielectric insulation layers may be formed between the metal layers. The metal layers may be assigned a predetermined power or signal voltage, such as a ground voltage. In an embodiment of the invention, a keep out zone, such as the keep out zones 44, 45 and 48 may be provided beneath (or, under or directly below) the inductor 46 in the package substrate and disposed is in a projection area P1 of the inductor 46 in the vertical direction.

According to an embodiment of the invention, the shielding structure 47 may be disposed in a keep out zone of the second layer in the package substrate, such as the keep out zone 45 in the embodiment shown in FIG. 4, under the inductor 46. In addition, in an embodiment of the invention, the shielding structure 47 may be a patterned ground shield (PGS) with a plurality of stripes and a plurality of slots between the strips.

According to an embodiment of the invention, at least two connections (as an example, ground connections) may be disposed aside the shielding structure 47 to connect the shielding structure 47 to the metal layers 45-1 and 45-2. In an embodiment of the invention, the metal layers 45-1 and 45-2 may be assigned ground voltage, and thus may be regarded as a ground plane. That is, the connections (as an example, ground connections) may be configured to connect the shielding structure 47 to the metal ground layer or the ground voltage of the same layer. In the embodiments of the invention, the connections (as an example, ground connections) may be implemented by traces or metal lines.

According to an embodiment of the invention, the line (which may be an invisible line) connecting the two connections may traverse the body of the shielding structure 47 and/or traverse the projection area P1 of the inductor 46.

As shown in FIG. 4, the at least two ground connections GC1 and GC2 may be configured to connect the shielding structure 47 and the metal layers 45-1 and 45-2 (e.g. the ground planes). The line (which may be an invisible line) the at least two ground connections GC1 and GC2 may traverse the body of the shielding structure 47 and/or traverse the projection area P1 of the inductor 46. According to an embodiment of the invention, the at least two ground connections GC1 and GC2 may be connected to different sides of the shielding structure to 47.

Figure 6:
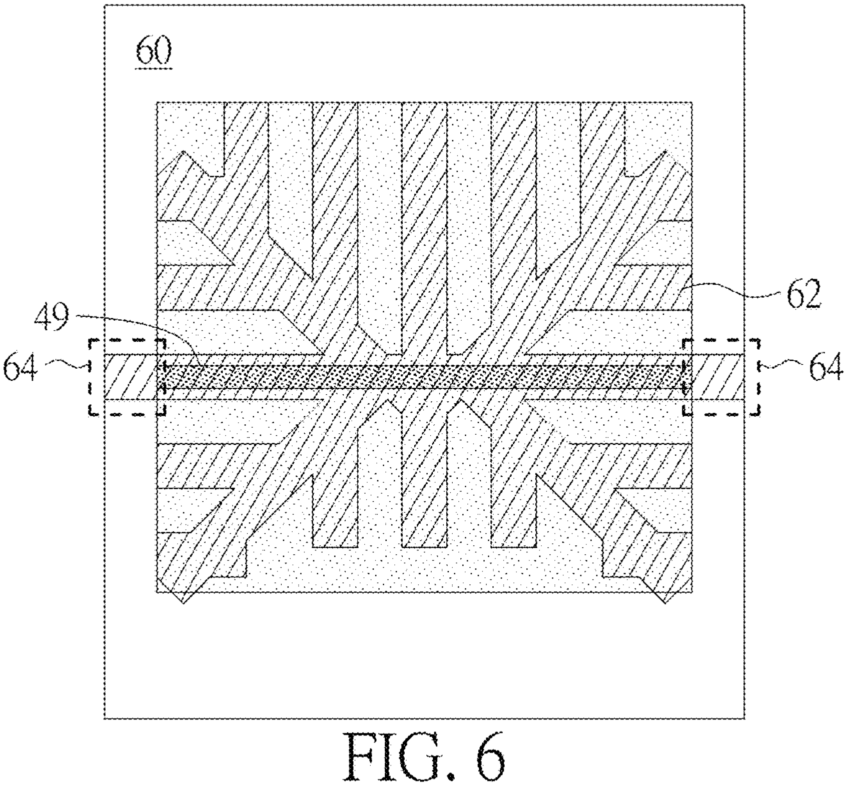
FIG. 6 is an exemplary layout showing the connections between the shielding structure and the package substrate according to an embodiment of the invention.

In addition, as shown in FIG. 6, according to an embodiment of the invention, the at least two ground connections GC1 and GC2 may be disposed above an aggressor device 49, and may be arranged along a direction in which a predetermined trace of the aggressor device 49 extends or arranged along a direction of a current flow of the aggressor device 49, where the predetermined trace may be configured to transmit power or signal. In the embodiment shown in FIG. 4, the direction in which a predetermined trace of the aggressor device 49 extends or the direction of a current flow of the aggressor device 49 may be the horizontal direction (e.g. from the metal layer 48-1 to the metal layer 48-2 or from the metal layer 48-2 to the metal layer 48-1). In addition, the line (which may be an invisible line) connecting the at least two ground connections GC1 and GC2 may also extend along the direction in which the predetermined trace of the aggressor device 49 extends or the direction of a current flow of the aggressor device 49. In addition, in the embodiment of the invention, the in-package shielding structure 47 may be inserted or disposed between the inductor 46 (which may be a victim device) and the aggressor device 49. That is, the inductor 46 may be placed at one side of the in-package shielding structure 47 and the aggressor device 49 may be placed at an opposite side of the in-package shielding structure 47. In addition, according to an embodiment of the invention, the at least two ground connections GC1 and GC2 may also be disposed in a projection area of the aggressor device 49 in a vertical direction (e.g. a direction from the package substrate to the semiconductor die) and/or the line (which may be an invisible line) connecting the at least two ground connections GC1 and GC2 may traverse the projection area of the aggressor device 49. Furthermore, the aggressor device 49 is disposed entirely within the projection area P1 of the electronic device, e.g. the inductor 46, when viewing along a direction from the semiconductor die portion 41 to the package substrate portion 43. Moreover, an entirety of the aggressor device 49 is disposed within a projection area P2 formed by the two ground connections GC1 and GC2 and the in-package shielding structure 47 when viewing along the direction from the semiconductor die portion 41 to the package substrate portion 43.

Figure 5:
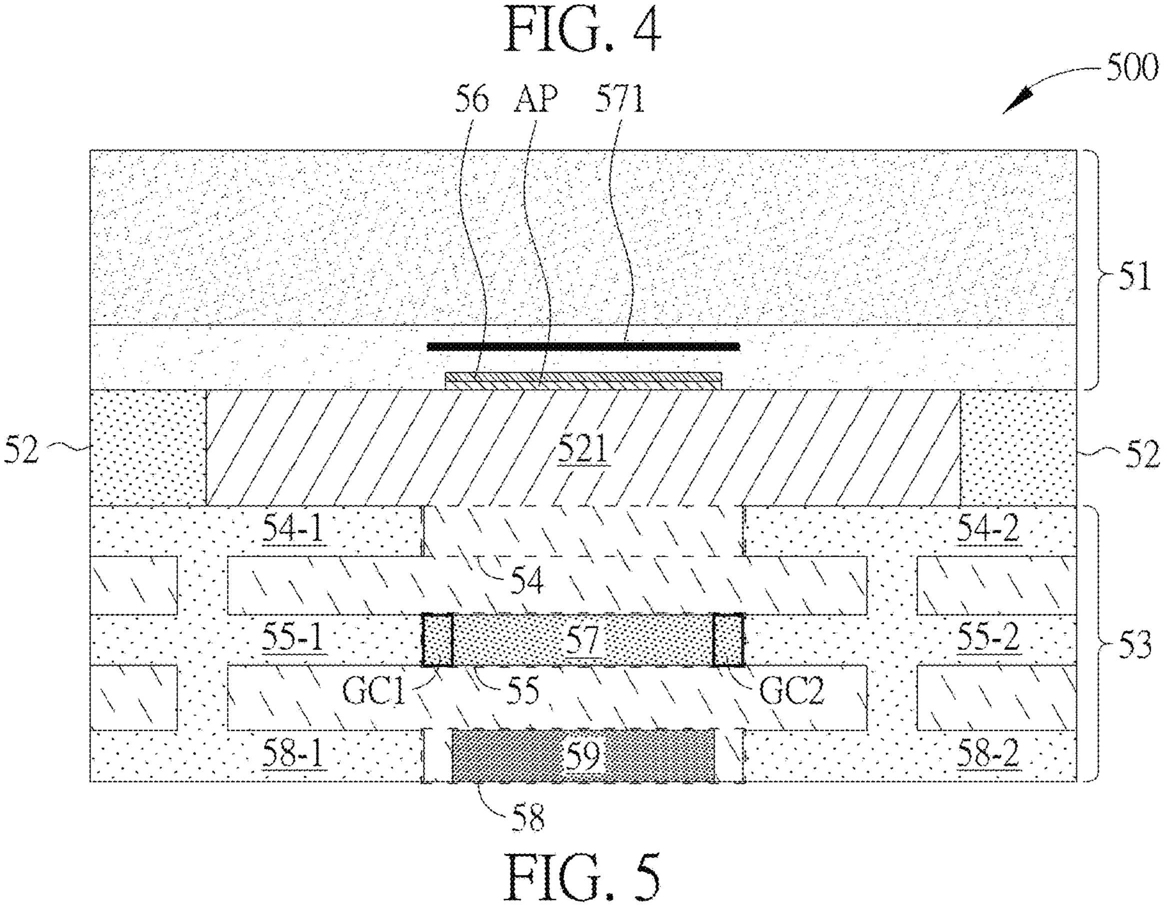
FIG. 5 is a drawing of partial enlargement of a section view of a semiconductor device according to an alternative embodiment of the invention.

FIG. 5 is a drawing of partial enlargement of a section view of a semiconductor device according to an alternative embodiment of the invention. The semiconductor device 500 may comprise a semiconductor die portion 51 and a package substrate portion 53. The semiconductor die portion 51 may be connected to package substrate portion 53 via solder balls (bumps) 52 and a underfill encapsulant 521 may be comprised in the gap between the semiconductor die and package substrate around solder balls 52. In another embodiment, a molding compound may be encapsulated surround the semiconductor die portion 51.

The package substrate portion 53 may comprise metal layers 54-1, 54-2, 55-1, 55-2, 58-1 and 58-2, keep out zones 54, 55 and 58 and an in-package shielding structure 57. At least two ground connections GC1 and GC2 may be arranged along a direction in which a predetermined trace extends, where the predetermined trace may be a trace of an aggressor device 59 configured to transmit power or signal, or arranged along a direction of a current flow of the aggressor device 59.

Different from the embodiment shown in FIG. 4, in the embodiment shown in FIG. 5, besides the electronic device, e.g. the inductor 56, the semiconductor die may further comprise an on-die shielding structure 571 formed inside of the semiconductor die and disposed above the inductor 56. The on-die shielding structure 571 as well as the in-package shielding structure 57 may be patterned ground shields (PGSs) with a plurality of stripes and a plurality of slots between the strips. The on-die shielding structure 571 may be disposed at one side of the inductor 56, and the in-package shielding structure 57 may be disposed at an opposite side of the inductor 56.

Most of the elements shown in FIG. 5 are the same as in FIG. 4. Since like reference numerals in FIG. 5 refer to like features in FIG. 4, details with respect to like elements in FIG. 5 will not be repeated herein.

FIG. 6 is an exemplary layout showing the connections between the shielding structure and the package substrate according to an embodiment of the invention. In the embodiment shown in FIG. 6, which is a perspective top view of a semiconductor device like FIG. 2, there are two ground connections 64 configured to connect the in-package PGS 62 to the ground plane 60 of the package substrate. The ground plane may be one or more of the neighboring metal layers of the in-package shielding structure as shown in FIG. 4 and FIG. 5. Note that in some embodiments of the invention, the ground connections may connect the in-package PGS (e.g. PGS 62) to the ground plane or the metal layers in the same layer. However, in other embodiments of the invention, the ground connections may connect the in-package PGS (e.g. PGS 62) to the ground plane or the metal layers in different layers. An experimental result shows that, with the proposed in-package PGS and the exemplary at least two ground connections as shown in FIG. 6, at least 10 dB noise reduction in the coupling noise accused by the aggressor device located in package to the victim's on-chip inductor is achieved as compared to the semiconductor structure without the proposed in-package PGS.

Figure 7:
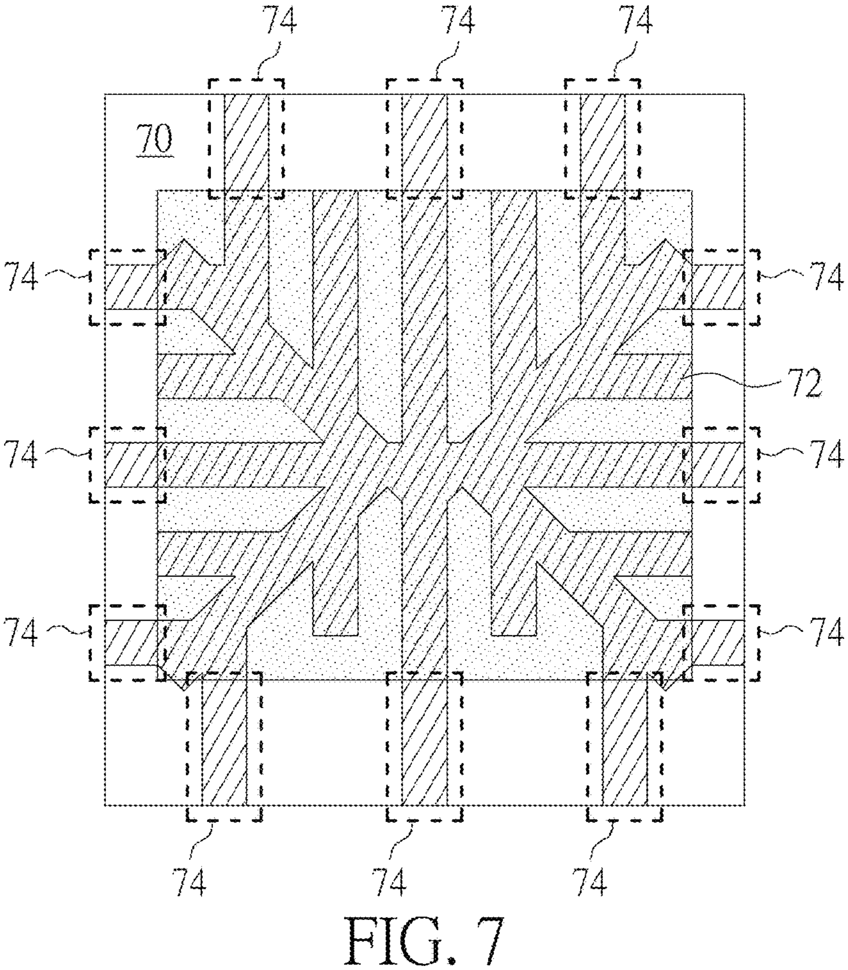
FIG. 7 is another exemplary layout showing the connections between the shielding structure and the package substrate according to an alternative embodiment of the invention.

FIG. 7 is another exemplary layout showing the connections between the shielding structure and the package substrate according to an alternative embodiment of the invention. Different from FIG. 6, the embodiment in FIG. 7 shows a strong connection between the in-package PGS and the ground. In the embodiment shown in FIG. 7, there are more than two ground connections (e.g. 12 ground connections) 74 configured to connect the in-package PGS 72 to the ground plane 70 of the package substrate. The strong ground connections may connect the in-package PGS (e.g. PGS 62) to the ground plane or the metal layers in the same layer or different layers. An experimental result shows that, with the proposed in-package PGS and the exemplary strong ground connections as shown in FIG. 7, at least 25 dB noise reduction in the coupling noise accused by the aggressor device located in package to the victim's on-chip inductor is achieved as compared to the semiconductor structure without the proposed in-package PGS.

It is to be noted that the number of ground connections shown in FIG. 6 and FIG. 7 are merely two possible implementations and the number of ground connections that could be used in the proposed semiconductor device structure such as the structures shown in FIG. 1 to FIG. 5 is not limited to the numbers shown in FIG. 6 and FIG. 7.

As discussed above, the proposed semiconductor device structure with at least an in-package shielding structure or PGS and the corresponding ground connection(s) are effective for the suppression of the coupling noise and are able to solve the problem of unwanted coupling noise in the conventional art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate;

a semiconductor die, disposed on the substrate and comprising an electronic device;

a first shielding structure, formed outside of the semiconductor die and disposed under the electronic device;

an aggressor device disposed entirely within a projection area of the electronic device when viewing along a direction from the semiconductor die to the substrate; and at least two ground connections, each being configured to connect the first shielding structure to a ground plane;

wherein the at least two ground connections are arranged along a direction in which a predetermined trace of the aggressor device extends, wherein the substrate comprises a first metal layer disposed below the semiconductor die, and the first shielding structure is disposed in the substrate and below the first metal layer, wherein the substrate further comprises a second metal layer disposed below the first metal layer and level with the first shielding structure, and a third metal layer disposed below the second metal layer.

2. The semiconductor device of claim 1, wherein the first shielding structure is disposed in a keep out zone of the substrate.

3. The semiconductor device of claim 2, wherein the keep out zone is disposed in the projection area of the electronic device in a vertical direction.

4. The semiconductor device of claim 1, wherein the first shielding structure is disposed in the projection area of the electronic device in a vertical direction.

5. The semiconductor device of claim 1, wherein the electronic device is an inductor and the first shielding structure is a patterned ground shield (PGS).

6. The semiconductor device of claim 1, wherein the at least two ground connections are connected to different sides of the first shielding structure and arranged along a direction of a current flow.

7. The semiconductor device of claim 1, wherein an entirety of the aggressor device is disposed within a projection area formed by the two ground connections and the first shielding structure when viewing along the direction from the semiconductor die to the substrate.

8. The semiconductor device of claim 1, wherein the electronic device is disposed on and directly contacts a metal layer, the metal layer directly contacts an underfill encapsulant, and the underfill encapsulant is disposed between the semiconductor die and the substrate.

9. A semiconductor device, comprising:

a substrate;

a semiconductor die, disposed on the substrate and comprising an electronic device;

a first shielding structure, formed outside of the semiconductor die and disposed under the electronic device;

a second shielding structure, formed inside of the semiconductor die and disposed above the electronic device;

an aggressor device disposed entirely within a projection area of the electronic device when viewing along a direction from the semiconductor die to the substrate; and at least two ground connections, each being configured to connect the first shielding structure to a ground plane;

wherein the at least two ground connections are arranged along a direction in which a predetermined trace of the aggressor device extends, wherein the substrate comprises a first metal layer disposed below the semiconductor die, and the first shielding structure is disposed in the substrate and below the first metal layer, wherein the substrate further comprises a second metal layer disposed below the first metal layer and level with the first shielding structure, and a third metal layer disposed below the second metal layer.

10. The semiconductor device of claim 9, wherein the first shielding structure is disposed in a keep out zone of the substrate.

11. The semiconductor device of claim 10, wherein the keep out zone is disposed in the projection area of the electronic device in a vertical direction.

12. The semiconductor device of claim 9, wherein the first shielding structure is disposed in the projection area of the electronic device in a vertical direction.

13. The semiconductor device of claim 9, wherein the electronic device is an inductor.

14. The semiconductor device of claim 9, wherein the first shielding structure and the second shielding structure are patterned ground shields (PGSs).

15. The semiconductor device of claim 9, wherein the at least two ground connections are connected to different sides of the first shielding structure and arranged along a direction of a current flow.

16. The semiconductor device of claim 9, wherein an entirety of the aggressor device is disposed within a projection area formed by the two ground connections and the first shielding structure when viewing along the direction from the semiconductor die to the substrate.

17. The semiconductor device of claim 9, wherein the electronic device is disposed on and directly contacts a metal layer, the metal layer directly contacts an underfill encapsulant, and the underfill encapsulant is disposed between the semiconductor die and the substrate.

* * * * *